(12) United States Patent
Li et al.

(10) Patent No.: US 12,176,232 B2
(45) Date of Patent: Dec. 24, 2024

(54) STOCKER SYSTEM FOR WAFER CASSETTE

(71) Applicant: Taiwan Semiconductor Manufacturing Co., Ltd., Hsinchu (TW)

(72) Inventors: Guancyun Li, Hsinchu (TW); Ching-Jung Chang, Hsinchu (TW); Chi-Feng Tung, Hsinchu (TW); Hsiang Yin Shen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/341,496

(22) Filed: Jun. 26, 2023

(65) Prior Publication Data

US 2023/0335422 A1 Oct. 19, 2023

Related U.S. Application Data

(62) Division of application No. 16/808,166, filed on Mar. 3, 2020, now Pat. No. 11,735,451.

(60) Provisional application No. 62/907,441, filed on Sep. 27, 2019.

(51) Int. Cl.
*H01L 21/67* (2006.01)
*B65D 81/02* (2006.01)
*H01L 21/677* (2006.01)

(52) U.S. Cl.
CPC ...... *H01L 21/67733* (2013.01); *B65D 81/022* (2013.01); *H01L 21/67271* (2013.01); *H01L 21/67706* (2013.01); *H01L 21/67724* (2013.01); *H01L 21/6773* (2013.01)

(58) Field of Classification Search
CPC ......... H01L 21/67733; H01L 21/67271; H01L 21/67706; H01L 21/67724; H01L 21/6773; H01L 21/67253; H01L 21/67775; H01L 21/67769; B65D 81/022
See application file for complete search history.

(56) References Cited

U.S. PATENT DOCUMENTS

| | | | | |
|---|---|---|---|---|
| 6,520,727 | B1 * | 2/2003 | Babbs | H01L 21/67775 414/217 |
| 2007/0098033 | A1 * | 5/2007 | DiSorbo | H01S 3/02 372/55 |
| 2016/0035607 | A1 * | 2/2016 | Lee | H01L 21/6773 414/808 |
| 2018/0061692 | A1 * | 3/2018 | Nishino | G05B 19/41865 |

(Continued)

*Primary Examiner* — S M Sohel Imtiaz
(74) *Attorney, Agent, or Firm* — Seed IP Law Group

(57) ABSTRACT

A support member system is described for association with an overhead transport system. The support member system provides a safety feature to the overhead transport system by which the overhead transport system is able to avoid damage to wafers that are contained within a wafer cassette that is unintentionally released by the overhead transport system. The support member system is able to prevent such released cassettes from impacting the ground or tools located under the overhead transport system. The support member system targets wafer cassettes that have dimensions which are different than the dimensions of wafer cassettes for which the overhead transport system was originally designed to transport. Stocker systems for receiving, storing and delivering different types of wafer cassettes are also described.

22 Claims, 9 Drawing Sheets

(56) References Cited

U.S. PATENT DOCUMENTS

2019/0168355 A1\* 6/2019 Suzuki ................. B24B 37/105
2020/0111694 A1\* 4/2020 Mori ................. H01L 21/67778

\* cited by examiner

STOCKER SYSTEM FOR WAFER CASSETTE

BACKGROUND

To produce semiconductor devices, a semiconductor substrate, such a silicon wafer, which is a raw material for the semiconductor devices, must go through a sequence of complicated and precise process steps. Often times, to complete the sequence, the wafer must be physically transported from one piece of fabrication equipment to another piece of fabrication equipment. Within these pieces of fabrication equipment various processes such as diffusion, ion implantation, chemical vapor deposition, photo lithography, etch, physical vapor deposition, and chemical mechanical polishing are carried out on the wafer. To efficiently move the wafer through the sequence and between the different pieces of fabrication equipment in a semiconductor fabrication plant (commonly called as "fab"), a plurality of wafers are housed in in a front opening unified pods (FOUP) and an automated material handling system (AMHS) is implemented in the fab to move the FOUP from one piece of fabrication equipment to another piece of fabrication equipment.

In some instances, an overhead transport vehicle is a part of the AMHS in the fab. The overhead transport vehicle is utilized to transport the FOUP by traveling on an overhead track and accessing a load port of a stocker or other process equipment (commonly called a "tool") directly.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
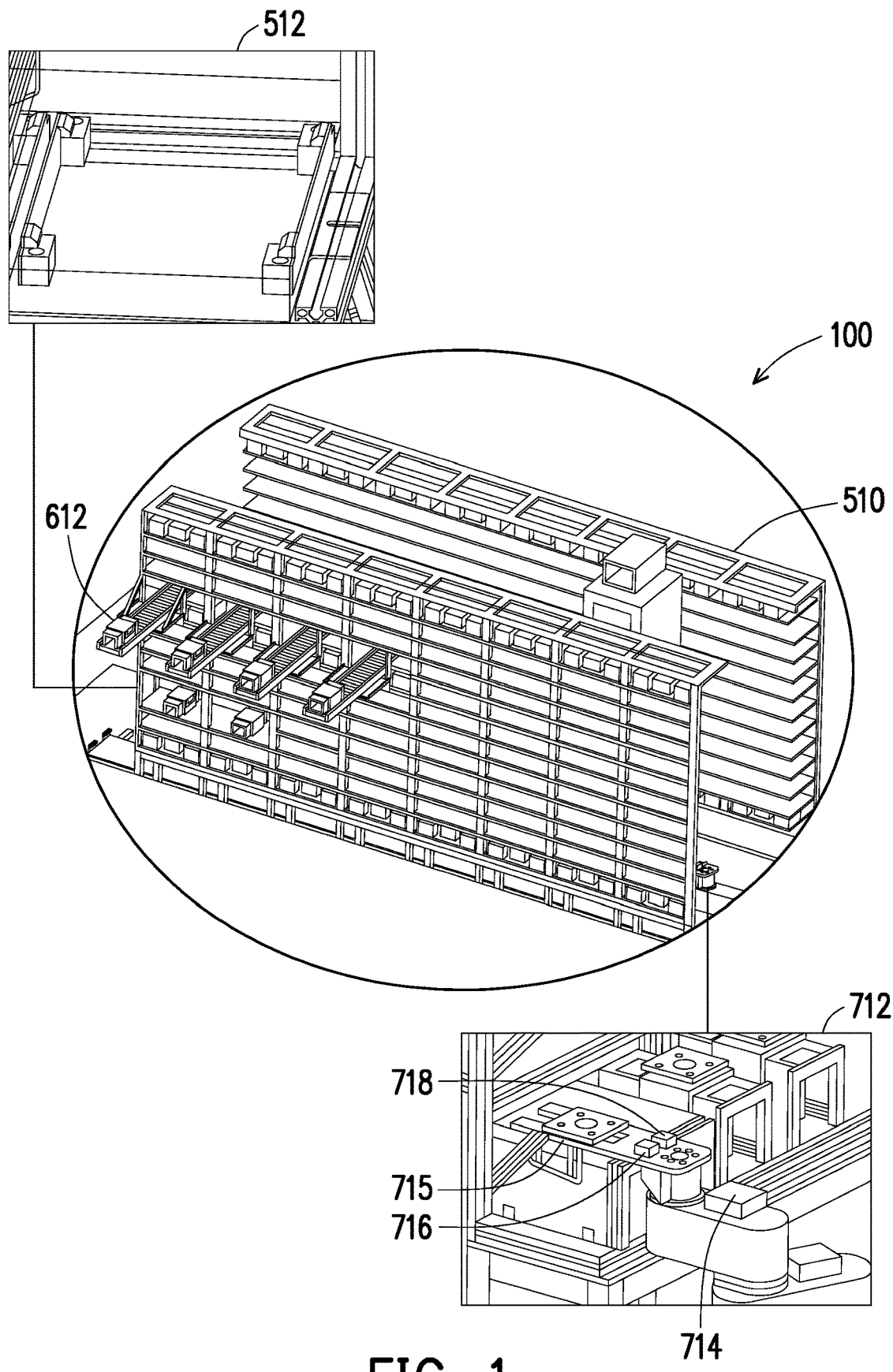
FIG. 1 is a perspective view illustrating overview of a stocker system 100 according to one or more embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments in accordance with subject matter described herein include an integrated wafer cassette stocker system that is able to receive, store and deliver wafer cassettes of different types and dimensions. Embodiments of such wafer cassette stocker systems include a support member system capable of being associated with an overhead transport system designed to handle one type of wafer cassette. Support member systems in accordance with embodiments described herein, allow such overhead transport systems to avoid damage to wafers when wafer cassettes, for which the overhead transport system was not originally designed to handle, are inadvertently released by the overhead transport system. The support member systems avoid damage to wafers contained within such inadvertently released wafer cassettes by preventing such released wafer cassettes from falling to the ground or onto tools located underneath the overhead transport system. Embodiments in accordance with the present disclosure also include a multi-cassette rack capable of receiving wafer cassettes of different types and dimensions, storing such wafer cassettes and delivering such wafer cassettes.

FIG. 1 is a perspective view illustrating overview of a stocker system 100 according to one or more embodiments of the present disclosure.

Referring to FIG. 1, the stocker system 100 includes a support member system 300 (shown in FIG. 2, but not shown in FIG. 1), a multi-cassette rack 510, and a multi-cassette sorter 712 in the multi-cassette rack 510. The multi-cassette rack 510 includes a multi-cassette port 512 and a multi-cassette overhead hoist transport port 612 (hereinafter "multi-cassette OHT port"). In accordance with some embodiments described herein, the stocker system 100 is integrated into an existing AMHS in a fab. In accordance with embodiments described herein, the stocker system 100 provides temporary storage for various types of cassettes as the cassettes work their way through the different tools in the fab.

Figure 2:
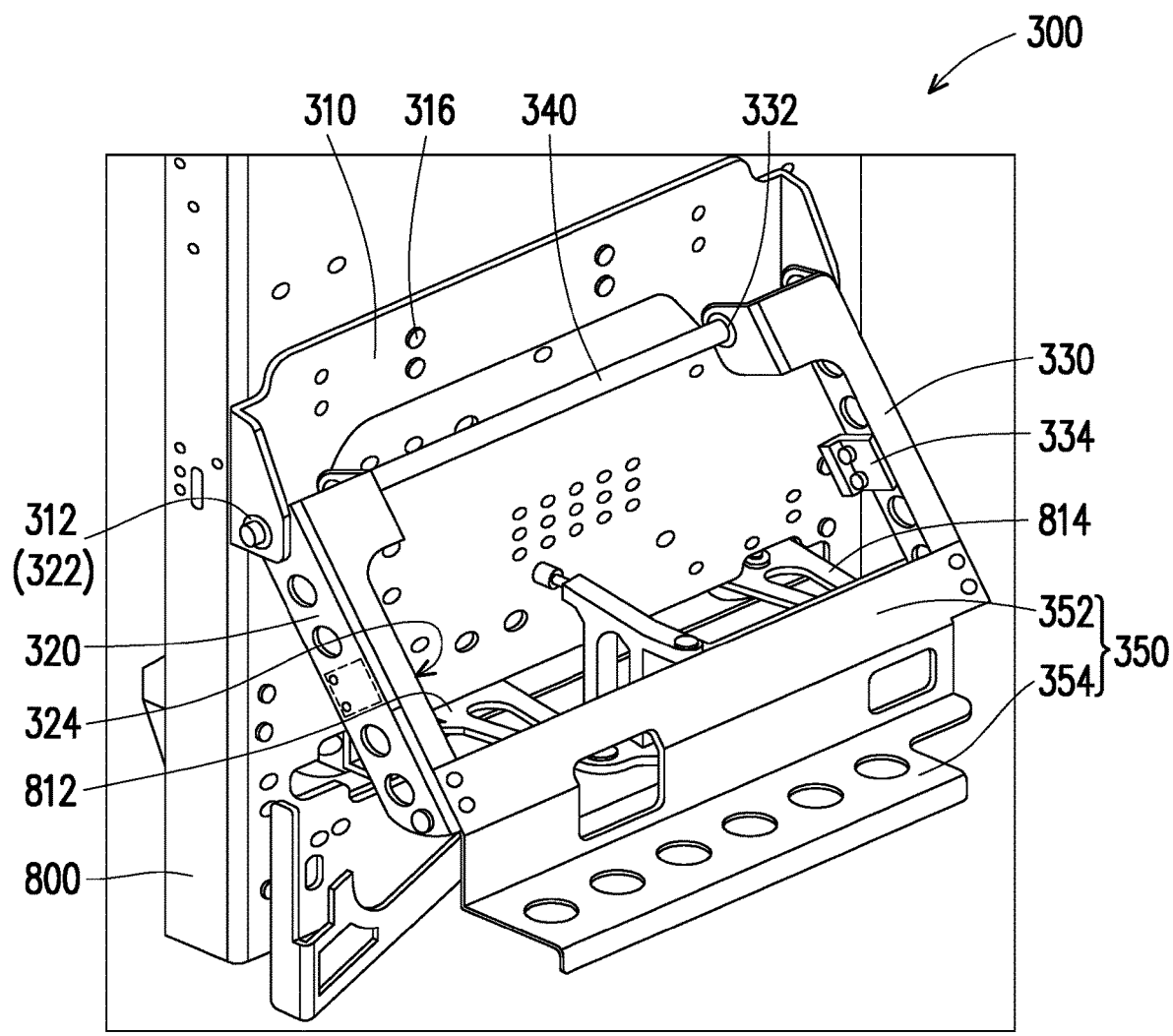
FIG. 2 is a left perspective view illustrating a support member system 300 associating with an overhead transport vehicle 800 according to one or more embodiments of the present disclosure.

FIG. 2 is a left perspective view illustrating the support member system 300 associating with an overhead transport vehicle 800 according to one or more embodiments of the present disclosure.

Figure 3:
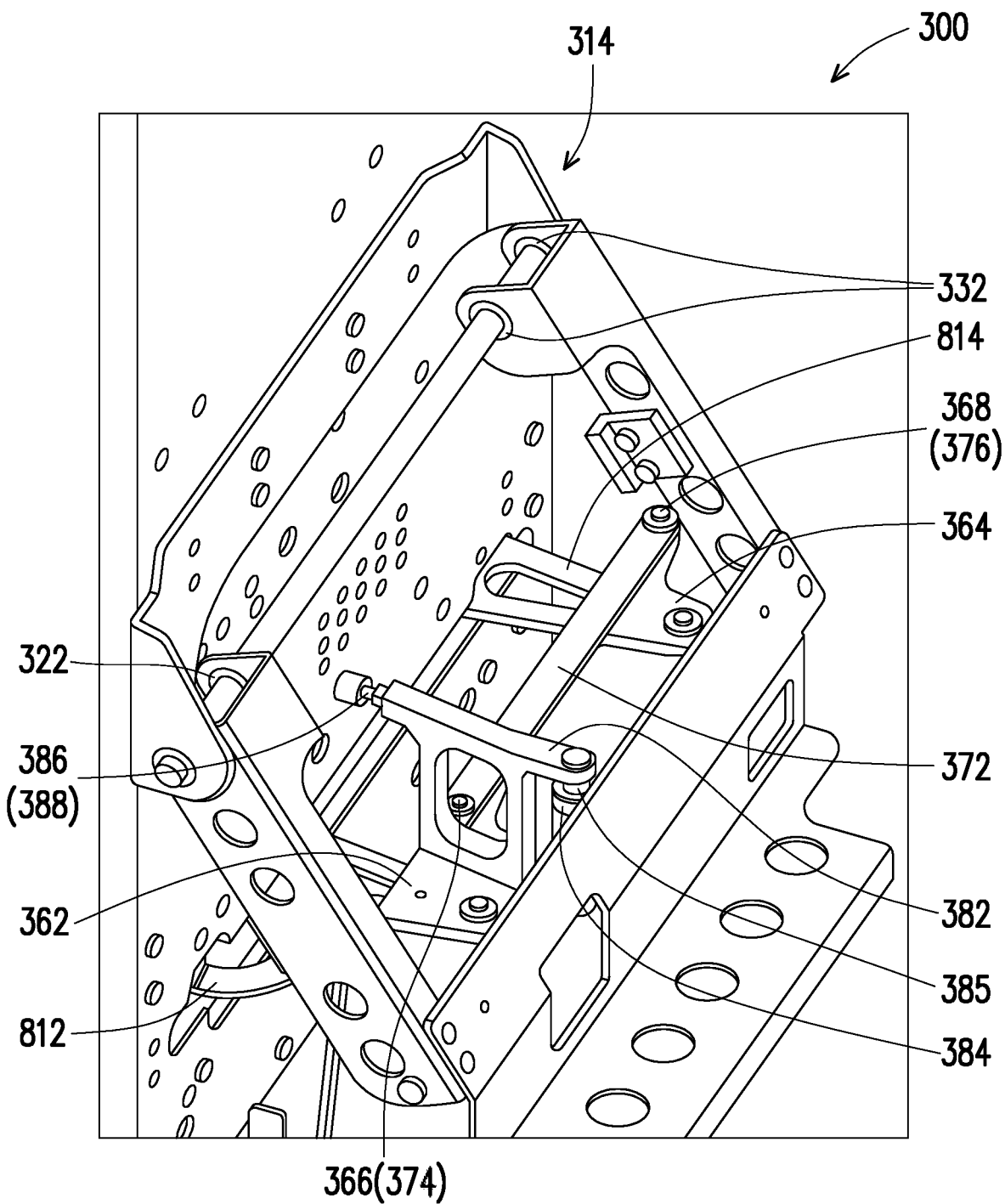
FIG. 3 is a top left perspective view illustrating the support member system 300 associating with an overhead transport vehicle 800 according to one or more embodiments of the present disclosure.

FIG. 3 is a top left perspective view illustrating the support member system 300 associating with the overhead transport vehicle 800 according to one or more embodiments of the present disclosure.

Referring to FIGS. 2 and 3, the support member system 300 according to one or more embodiments of the present disclosure includes a bracket 310, a first support arm 320, a second support arm 330, an axle 340, and a support member 350. In the illustrated embodiment, the support member system 300 can be attached to or detached from the overhead transport vehicle 800. When attached to the overhead transport vehicle 800, the support member system 300 is able to support various types of wafer cassettes with no or small changes to the overhead transport vehicle 800. The support member system 300 is movable between different positions. In one position (e.g., a release position which is associated with a step in the fabrication process when the wafer cassette is to be released by the overhead transport vehicle) the support member system 300 is able to allow the transfer of a wafer cassette from the overhead transport vehicle to a tool and in a different position (e.g., a support position which is occupied when the fabrication process is at a stage where the wafer cassette needs to be retained by the overhead transport vehicle) in which the support member system 300 is able to prevent a wafer cassette that is accidentally released by the overhead transport vehicle or is unintentionally disengaged from the overhead transport vehicle from impacting the ground or a tool that is below the accidentally released or disengaged wafer cassette.

In accordance with embodiments illustrated in FIGS. 2 and 3, the bracket 310 is secured to a portion of overhead transport vehicle via one or more connection points 312. Various types of fasteners such as rivets, bolts and nuts, screws and then like can be used at connection points 312, to secure bracket 310 to the overhead transport vehicle. Bracket 310 includes a first end and a second end opposite the first end with a first pivot point 312 located at the first end of bracket 310, a second pivot point 314 (not visible in FIGS. 2 and 3) located at the second end of bracket 310 (similarly to where the first pivot point 312 located at the first end of bracket 310). In the embodiment illustrated in FIGS. 2 and 3, at least one connection point 316 is located between the first end and the second end of bracket. As illustrated in FIGS. 2 and 3, the at least one connection point 316 may include two or more connection points and each connection point may include more than one fastener.

As shown in FIGS. 2 and 3, the first pivot point 316 is located at the first end of the bracket 310 and the second pivot point 314 is located at the second end of the bracket 310 (e.g., an opposite location with respect to the first pivot point 312). At the first pivot point 316 and the second pivot point 314, the bracket 310 is pivotally connected to a first support arm 320 and the second support arm 330, respectively.

Bracket 310 is constructed of any suitable material that can carry the weight of the wafer cassette (e.g., tray and magazine), wafers in the wafer cassette, and components of the support member system 300, such as the first support arm 320, the second support arm 330, the axle 340, and the support member 350. For example, the bracket 310 may be constructed of plastic, composite material, aluminum, magnesium, steel and the like, and combinations thereof.

Further, if the material from which the bracket 310 is constructed is sturdy enough to have one or more openings, the bracket may include one or more openings in the body of the bracket 310 to reduce the weight of the support member system 300. Bracket 310 is not limited to being constructed from the exemplary materials mentioned above but may be formed of any material strong enough to support a wafer cassette. The width of the bracket 310 between first pivot point 312 and second pivot point 314 may be adjustable (e.g., longer or shorter) so bracket 310 can be fitted to different overhead transport vehicle models with different designs (e.g., different manufacturers, different models, and different sizes of the wafer cassettes the overhead transport vehicle is designed to transport).

First support arm 320 is pivotally connected to the first end of bracket 310 at a third pivot point 322 located on a third end of the first support arm 320. A second support arm 330 is pivotally connected to the second end of bracket 310 at a fourth pivot point 332 located on a fourth end of second support arm 330. The third pivot point 322 is used to rotatably couple the first support arm 320 to the first end bracket 310. In the illustrated embodiment, third pivot point 322 includes one or more pivot points to stabilize the pivoting motion of first support arm 320 around axle 340.

First support arm 320 may be constructed of any suitable material that can carry the weight of the wafer cassette (e.g., tray and magazine), wafers in the wafer cassette, and the support member 350. For example, the first support arm 320 may be constructed of plastic, composite material, aluminum, magnesium, steel and the like, and combinations thereof.

Further, if the material from which first support arm 320 is constructed is sturdy enough, first support arm 320 may include one or more openings in the body of the bracket 310 to reduce the weight of the support member system 300. First support arm 320 is not limited to being constructed from the exemplary materials mentioned above but may be formed of any material strong enough to support a wafer cassette. The size, (e.g., length) of the first support arm 320 can be varied or be adjustable (e.g., made short or longer) so the first support arm 320 can be used with overhead transport vehicle models with different designs (e.g., different manufacturers, different models, and different sizes of the wafers the overhead transport vehicle is designed to transport).

In the illustrated embodiments, the first support arm 320 includes a first stopper (not visible in FIGS. 2 and 3, but located on first support arm 320 similarly to where second stopper 334 is located on second support arm 330) to locate the first support arm 320 in a predetermined position when support member system 300 is disengaged. First stopper 324 may include an elastic material to cushion the impact of first support arm 320 against a surface of overhead transport vehicle 800.

Second support arm 330 includes a fourth pivot point 332 located on a fourth end of second support arm 330. Second support arm 330 is pivotally coupled to bracket 310 by axle 340 at fourth pivot point 332. The fourth pivot point 332 includes one or more pivot points to stabilize the pivoting motion of second support arm 330 around axle 340.

The second support arm 330 may be constructed of any suitable material that can support the weight of the wafer cassette (e.g., tray and magazine), wafers in the wafer cassette, and the support member 350. For example, the second support arm 330 may be constructed of plastic, composite material, aluminum, magnesium, steel and the like, and combinations thereof.

Further, if the material from which the second support arm 330 is constructed is sturdy enough to have one or more openings, the second support arm 330 may include one or more openings in the body of the second support arm 330 to reduce the weight of the support member system 300. Second support arm 330 is not limited to being constructed from the exemplary materials mentioned above but may be formed of any material strong enough to support a wafer cassette. The size (e.g., length) of the second support arm 330 can be varied or be adjustable (e.g., made shorter or longer) so the second support arm 330 can be used with overhead transport vehicle models with different designs (e.g., different manufacturers, different models, and different sizes of the wafer the overhead transport vehicle is to transport).

As noted above, second support arm 330 includes a second stopper 334 to locate second support arm 330 in a predetermined position when the support member system 300 is disengaged. The second stopper 334 may include an elastic material to cushion the impact of second support arm 330 against a surface of the overhead transport vehicle 800.

Axle 340 extends through the first pivot point 312, the second pivot point 314, the third pivot point 322, and the fourth pivot point 332 and pivotally couples first and second support arms 320, 330 to bracket 310. By having the first and second support arms 320, 330 pivoting back and forth relative to the pivotal axis defined by axle 340, the support member system 300 is able to move between in different positions (e.g., release position and a support position described above).

The axle 340 may be constructed of any suitable material that can support the weight of the wafer cassette (e.g., tray and magazine), wafers in the wafer cassette, and the other components such as the first support arm 320, the second support arm 330, and the support member 350. For example, the axle 340 may be constructed of plastic, composite material, aluminum, magnesium, steel and the like, and combinations thereof. The axle 340 may be hollow inside to reduce the weight of the support member system 300.

In accordance with embodiments of support member system 300 described herein, support member 350 is coupled to the first support arm 320 and the second support arm 330. For example, support member 350 is coupled to an end of first support arm 320 opposite third end of first support arm 320 and is coupled to an end of the second support arm 330 opposite the fourth end of the second support arm 330. The support member 350 is coupled to the first and second support arms 320, 330 in any suitable manner, include using a bolt, a nut, an opening, an aperture, a hole, a groove, a guide, a hook, a latch, an interlock, a fastener, a screw, a pin and the like, and combinations thereof.

The support member 350 includes a sidewall member 352 and a plate 354. The sidewall member 352 is coupled to the end of the first support arm 320 opposite the third end of the first support arm 320 and is coupled to the end of the second support arm 330 opposite the fourth end of the second support arm 330. The plate 354 is connected to an edge of the sidewall member 352, orienting the plate 354 substantially perpendicular to a portion of the sidewall member 352. In the illustrated embodiment, a cross-section of support member 350 perpendicular to its length has an L-shape. The sidewall member 352 and the plate 354 are constructed from one piece of material or formed from more than one piece of material.

The sidewall member 352 and the plate 354 may be constructed of any suitable material that can carry the weight of the wafer cassette (e.g., tray and magazine), wafers in the wafer cassette. For example, the sidewall member 352 and the plate 354 may be constructed of plastic, composite material, aluminum, magnesium, steel and the like, and combinations thereof.

When the material used to construct the sidewall member 352 and the plate 354 is sturdy enough to have one or more openings, the sidewall member 352 and plate 354 may include one or more openings to reduce the weight of the support member system 300. One skilled in the art will realize that the sidewall member 352 and plate 354 are not limited to the exemplary materials mentioned above but may be formed of other material able to support the weight of the wafer cassette and wafers in the wafer cassette. The size (e.g., its length or width) of the sidewall member 352 and the plate 354 between first support arm 320 and second support arm 330 may be varied or made adjustable (e.g., made shorter or longer) so the sidewall member 352 and the plate 354 can accommodate overhead transport vehicle models with different designs (e.g., different manufacturers, different models, and different sizes of the wafer the overhead transport vehicle is designed to transport).

Referring to FIG. 2, the support member system 300 according to one or more embodiments of the present disclosure includes a first interface member 362, a second interface member 364, a joint bar 372, and a transfer member 382 connected to one of or both of the first interface member 362 and the second interface member 364.

In the illustrated embodiment, the first interface member 362 is attached to a first support member 812 of the overhead transport vehicle 800 when the support member system 300 of the disclosed embodiments is associated with the overhead transport vehicle 800. The second interface member 364 is connected to a second support member 814 of the overhead transport vehicle 800 when the bracket 310 is associated with the overhead transport vehicle 800. The first and second support members 812 and 814 of the overhead transport vehicle 800 are movable from a wafer cassette release position in which the first and second support members 812 and 814 have been moved inward toward overhead transport vehicle 800, e.g., rotated inward toward overhead transport vehicle 800 and a wafer cassette support position in which the first and second support members 812 and 814 has been moved outward away from overhead transport vehicle 800, e.g., rotated outward away from overhead transport vehicle 800. For example, when the overhead transport vehicle 800 is transporting a FOUP, the first and second support members 812, 814 of the overhead transport vehicle 800 are rotated out (or extended out) as a backup to support the FOUP in case of an unintentional FOUP discharge or unintentional release of the FOUP from overhead transport vehicle 800 (e.g., a wafer cassette support position). In the wafer cassette release position, the FOUP is being intentionally unloaded from the overhead transport vehicle 800, e.g., to the load port of a wafer cassette stocker or other process equipment, in which case the first and second support members 812 and 814 of the overhead transport vehicle 800 are rotated in (or retracted towards the overhead transport vehicle 800).

The first and second support members 812, 814 operate in the same fashion for other wafer cassette types smaller than a FOUP (e.g., tray and magazine). However, the first and second support members 812, 814 of the overhead transport vehicle 800 do not have a proper structure or dimensions to provide the same safety feature of the support position for wafer cassette types smaller than a FOUP due to the dimensions, e.g., length and width, and the location of the first and second support members 812, 814 on the overhead transport vehicle 800—i.e., first and second support members 812 and 814 are not suitable to support, e.g., "catch" wafer cassettes that are smaller than the FOUP, for which the overhead transport vehicle was designed to transport, in the event of accidental discharge or release of the smaller wafer cassettes by the overhead transport vehicle 800. The support member system 300. In accordance with embodiments described herein is associated with the first and second support members 812 and 814 of overhead transport vehicle 800 and provides an adequate structure "catching" wafer cassettes smaller than the FOUP for which a overhead transport vehicle 800 was designed to transport without making significant changes to the existing safety apparatus of the overhead transport vehicle 800 (e.g., first and second support members 812, 814). For example, embodiments of a support member system 300 in accordance with the present disclosure can be installed on an existing overhead transport system 800 by removing an original joint bar between the first support member of the overhead transport vehicle 812 and the second support member of the overhead transport vehicle 814, securing bracket 310 to the overhead transport system 800, installing the first interface member 362 on the first support member 812 and installing the second interface member 364 on the second support member 814. In other words, a support member system 300 in accordance with embodiments described herein provides a safety mechanism whereby an overhead transport system can safely transport wafer cassettes that are smaller in size than the FOUPs for which the overhead transport system was originally designed to transport.

The first interface member 362 and the second interface member 364 are attached to the first support member of the overhead transport vehicle 812 and the second support member of the overhead transport vehicle 814 respectively using any suitable methods that may include an opening, an aperture, a hole, a groove, a guide, a hook, a latch, an interlock, a fastener, a screw, a pin and the like, and combinations thereof. The first interface member 362, the second interface member 364 and transfer member 382 are configured to transfer to the sidewall member 352 the movement which results in the extension or retraction of the first and second support members of the overhead transport vehicle 812, 814. First interface member 362 includes a first rotating point 366 and the second interface member 364 includes a second rotating point 368. The joint bar 372 extends between the first rotating point 366 and the second rotating point 368 and is rotatably secured to the first interface member 362 at the first rotating point 366 and rotatably secured to the second interface member 364 at the second rotating point 368. The first and second rotating points 366, 368 may be constructed of any suitable materials and may include opening, an aperture, a hole, a pin, a loose rivet and the like, and combinations thereof. As discussed above, the first and second interface members 362, 364 rotate according to the movement of the first and second support members of the overhead transport vehicle 812, 814.

The joint bar 372 extending from the first interface member 362 to the second interface member 364 include a third rotating point 374 on one end of the joint bar 372 and a fourth rotating point 376 on the other end of the joint bar 372. The third and fourth rotating points 374, 376 connected to the first and second rotating points 366, 368 respectively allow the joint bar 372 to stay connected to the first interface member 362 and the second interface member 364 as the first interface member 362 and the second interface member 364 rotate in or out according to the movement of the first and second support members of the overhead transport vehicle 812, 814. The third and fourth rotating points 374, 376 may be constructed of any suitable materials and may include opening, an aperture, a hole, a pin, a loose rivet and the like, and combinations thereof.

The joint bar 372 may be constructed of any suitable material. For example, the joint bar 372 may be constructed of plastic, composite material, aluminum, magnesium, steel and the like, and combinations thereof.

Further, if the material used to construct the joint bar 372 is sturdy enough to have one or more openings, the joint bar 372 may include one or more openings in the body of the joint bar 372 to reduce the weight of the support member system 300. Joint bar 372 is not limited to the exemplary materials mentioned above but may be formed of any material. The size, e.g., length and/or width of the joint bar 372 may be adjustable (e.g., make longer or shorter) so the joint bar 372 can accommodate different overhead transport vehicle models with different designs (e.g., different manufacturers, different models, and different sizes of the wafer the overhead transport vehicle is designed to transport).

In accordance with embodiments of the present disclosure, transfer member 382 is coupled to one of or both of the first interface member 362 and the second interface member 364. In the embodiment illustrated in FIGS. 1 and 2, the transfer member 382 is coupled to first interface member 362 and includes at one end a roller 384 and at an opposite end a stabilizer 386.

To accommodate the roller 384 disposed substantially parallel in a vertical direction to the sidewall member 352, the transfer member 382 includes a vertical rotating axle 385 disposed substantially parallel in a vertical direction to the sidewall member 352. The roller 384 is mounted on rotating axle 385 transfers movement of one or both of the first interface member 362 and the second interface member 364 to the sidewall member 352. For example, as the first and second support members of the overhead transport vehicle 812, 814 rotate out (or extend), the first and second interface members 362, 364 also rotate and move to an extended (outward most position illustrated in FIGS. 1 and 2) accordingly. Ultimately, the transfer member 382 connected to one of or both of the first interface member 362 and the second interface member 364 also rotates accordingly and moves along the backside of sidewall member 352. As transfer member 382 rotates from a retracted position, e.g., a position parallel to the surface of overhead transport system 800 to which support member system 300 is secured, to an extended position (e.g., a position perpendicular to the surface of overhead transport system 800 to which support member system 300 is secured, roller 384 contacting the backside of sidewall member 352 pushes on the backside of sidewall member 352 until the transfer member 382 is substantially perpendicular to the sidewall member 352. When transfer member 382 a substantially perpendicular to sidewall member 352, support member system 300 occupies an extended or support position.

In the extended or support position, a lower portion of the plate 354 which extends from the sidewall member 352 is located as a backup to support a wafer cassette in case of an unintentional wafer cassette discharge when the overhead transport vehicle 800 is transporting wafer cassette smaller than the FOUP (e.g., tray and magazine).

In accordance with embodiments of the present disclosure, the stabilizer 386 is located on the end of the transfer member 382 opposite from the roller 384. When the transfer member 382 is substantially perpendicular to the sidewall member 352 and the surface of the overhead transport system 800 to which the support member system 300 is secured, as shown in FIGS. 2 and 3, the stabilizer 386 on the end of transfer member 382 becomes substantially perpendicular to the inner side of the overhead transport vehicle 800 to which support member system 300 is secured. As a result, the transfer member 382, which is in contact with the inner side of overhead transport vehicle 800 to which support member system 300 is secured and the sidewall member 352, provides additional structural support to the overall support member system 300 when it is in the support position.

In some embodiments in accordance with the present disclosure, the stabilizer 386 includes a damper 388. The damper 388 absorbs forces resulting for an impact on the support member system 300 resulting from wafer cassette being dropped on the plate 354. The damper 388 may include a spring, a gas spring, a fluid spring, or other cushioning structure. The damper 388 is configured to absorb energy from the impact to protect the wafers in the cassette.

According to one or more embodiments of present disclosure, the support member system 300 is configured to be installed to a side of the overhead transport vehicle 800 to provide a safety feature to wafer cassettes smaller than the FOUP (e.g., tray and magazine). Here, the safety feature extended by the support member system 300 includes providing a support member system 300 which can secure wafer cassettes smaller than wafer cassettes and/or FOUPs for which the overhead transport vehicle was originally designed, especially in case of a hoisting mechanism failure on the overhead transport vehicle 800. The failure can be triggered by internal mechanical issues with the hoisting mechanism or external environment (e.g., earthquake) and can result in the hoisting mechanism unintentionally releasing the wafer cassette in which case the released wafer cassette can impact the ground or a tool below the hoisting mechanism. Such impact can destroy or damage wafers contained in the wafer cassette.

Upon installation, the support member system 300 on the overhead transport vehicle 800 will work with the existing safety apparatus of the overhead transport vehicle 812, 814 and extend the safety feature of the first and second support members of the overhead transport vehicle 812, 814 to wafer cassettes smaller than the FOUP (e.g., tray and magazine) that are transported by the overhead transport vehicle. In accordance with embodiments described herein, a pair of the support member systems 300 are installed, e.g., one support member system 300 is installed on a first inner side of the overhead transport vehicle and a second support member system 300 is installed on a second inner side of the vehicle opposite the first inner side.

Figure 4:
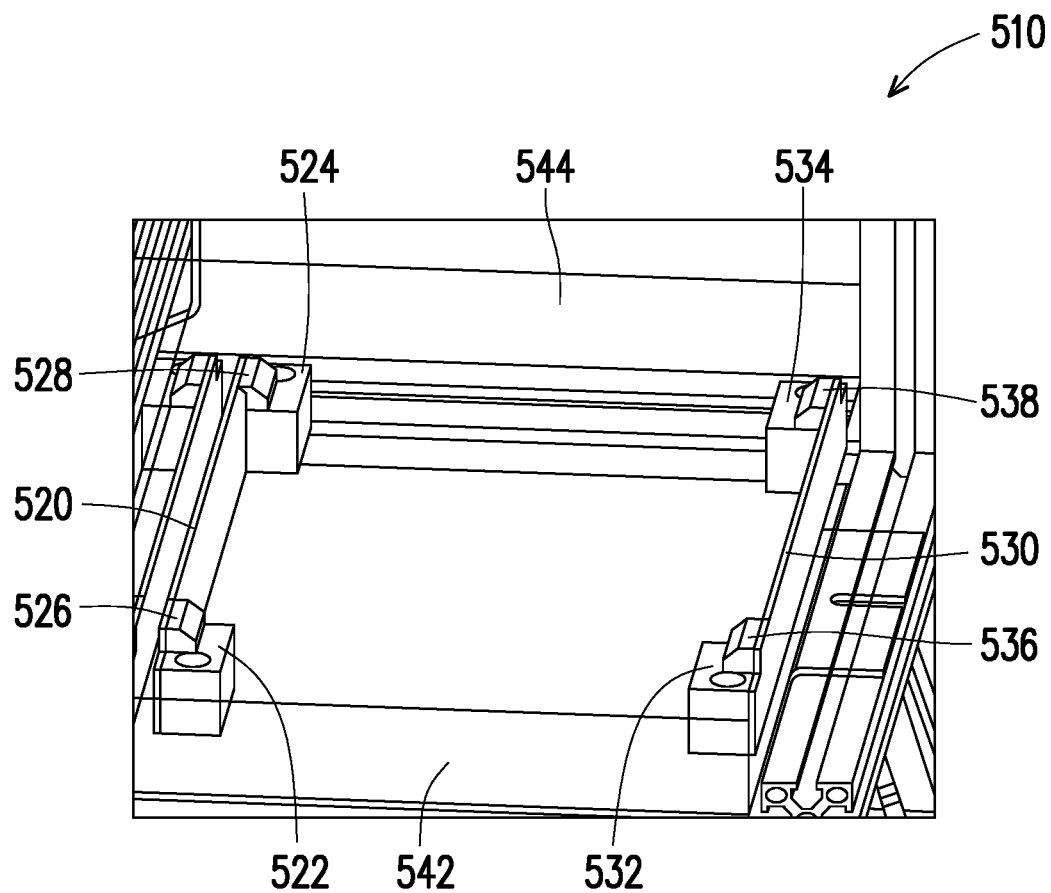
FIG. 4 is a perspective view illustrating a multi-cassette port 512 in a multi-cassette rack 510 according to one or more embodiments of the present disclosure.

FIG. 4 is a perspective view illustrating the multi-cassette port 512 in the multi-cassette rack 510 according to one or more embodiments of the present disclosure.

Referring to FIG. 4, the multi-cassette rack 510 according to one or more embodiments of the present disclosure includes a multi-cassette port 512 for receiving various types of wafer cassettes transported by a person, a person guided vehicle, or an automated guided vehicle. Accordingly, the multi-cassette port 512, having one or more loading or unloading locations for the wafer cassettes, includes a first guide arm 520 attached to the multi-cassette rack 510 at the loading location, and a second guide arm 530 attached to the multi-cassette rack 510 at the loading location. The second guide arm 530 is disposed parallel to the first guide arm 520. The first guide arm 520 and the second guide arm 530 are spaced apart from each other to accommodate various types of wafer cassette (e.g., tray and magazine of different dimensions).

The first guide arm 520 and the second guide arm 530 may be constructed of any suitable material that can carry the weight of the wafer cassette (e.g., tray and magazine) and wafers in the wafer cassette. For example, the first guide arm 520 and the second guide arm 530 may be constructed of plastic, composite material, aluminum, magnesium, steel and the like, and combinations thereof. To prevent or reduce the buildup of static electricity, the first guide arm 520 and the second guide arm 530 may include anti-static material. For example, anti-static plastic material may be utilized to construct or enclose the first guide arm 520 and the second guide arm 530. The first and second guide arms 520, 530 may be constructed with one piece or assembled with more than one piece.

In accordance with embodiments described herein, the first guide arm 520 and the second guide arm 530 have a length greater than about 10 mm. To accommodate various types of wafer cassette, a distance between first guide arm 520 and the second guide arm 530 may be about 100 mm or longer. The distance between the first guide arm 520 and the second guide arm 530 may be adjustable to accommodate different types of the wafer cassette.

The first guide arm 520 includes a first front guide block 522, a first rear guide block 524, a first front upper guide body 526, and a first rear upper guide body 528.

The first front guide block 522 is disposed at a front end of the first guide arm 520. The first front guide block 522 includes a hexahedron shape, a cube shape, rectangular prism shape, or any other shape that includes a flat top surface.

The first rear guide block 524 is disposed at a rear end of the first guide arm 520. The first rear guide block 524 includes a hexahedron shape, a cube shape, rectangular prism shape, or any other shape that includes a flat top surface.

In accordance with some embodiments described herein, the first front guide block 522 has a width greater than 10 mm, and the first rear guide block 524 has a width greater than 10 mm. The first front guide block 522 and the first rear guide block 524 may have different widths. Further, the first front guide block 522 and the first rear guide block 524 may have a height greater than 10 mm.

The first guide arm 520 includes a first front upper guide body 526 disposed on the first front guide block 522. The first front upper guide body 526 includes an inclined surface. The inclined surface on the first front upper guide body 526 is arranged to face the second guide arm 530. The size of the first front upper guide body 526 is smaller than the size of the first front guide block 522.

The first guide arm 520 includes a first rear upper guide body 528 disposed on the first rear guide block 524. The first rear upper guide body 528 includes an inclined surface. The inclined surface on the first rear upper guide body 528 is arranged to face the second guide arm 530. The size of the first rear upper guide body 528 is smaller than the size of the first rear guide block 524.

The second guide arm 530 includes a second front guide block 532, a second rear guide block 534, a second front upper guide body 536, and a second rear upper guide body 538.

The second front guide block 532 is disposed at a front end of the second guide arm 530. The second front guide block 532 may include a hexahedron shape, a cube shape, a rectangular prism shape, or any other shape that includes a flat top surface.

The second rear guide block 534 is disposed at a rear end of the second guide arm 530. The second rear guide block 534 may include a hexahedron shape, a cube shape, a rectangular prism, or any other shape that includes a flat top surface.

The second front guide block 532 has a width greater than 10 mm, and the second rear guide block 534 has a width greater than 10 mm. The second front guide block 532 and the second rear guide block 534 may have different widths. Further, the second front guide block 532 and the second rear guide block 534 may have a height greater than 10 mm.

The second guide arm 530 includes a second front upper guide body 536 disposed on the second front guide block 532. The second front upper guide body 536 includes an inclined surface. The inclined surface on the second front upper guide body 536 may face the first guide arm 520. The size of the second front upper guide body 536 may be smaller than the size of the second front guide block 532.

The second guide arm 530 includes a second rear upper guide body 538 disposed on the second rear guide block 534. The second rear upper guide body 538 includes an inclined surface. The inclined surface on the second rear upper guide body 538 may face the first guide arm 520. The size of the second rear upper guide body 538 may be smaller than the size of the second rear guide block 534.

In accordance with disclosed embodiments, the inclined surface of the first front upper guide body 526 faces the inclined surface of the second front upper guide body 536 at about 45 degrees. The inclined surface of the first rear upper guide body 528 faces the inclined surface of the second rear upper guide body 538 at about 45 degrees.

The multi-cassette port 512 supports various types of wafer cassette (e.g., wafer cassettes of different dimensions and shapes) and is configured to keep the wafer cassettes from falling off from the multi-cassette rack 510 in case of earthquake or similar situations.

Referring to FIG. 4, the multi-cassette rack 510 according to one or more embodiments of the present disclosure includes a front barrier 542 disposed in front of the first guide arm 520 and the second guide arm 530 in FIG. 4 and extending across an opening between the first guide arm 520 and the second guide arm 530. The front barrier 542 and the guide arms 520, 530 may have the same height or different heights. For example, the height of the front barrier 542 may be greater than the height of the guide arms 520, 530 (e.g., about 15 mm or greater). The front barrier 542 is disposed in the front of the guide arms 520, 530 and the opening therebetween so as to fence off one or more of the wafer cassettes loading locations. Here, the front barrier 542 is configured to keep the wafer cassette from falling off from the wafer cassette loading location in case of earthquake or similar situations by moving forward through the opening between the first guide arm 520 and the second guide arm 530.

The multi-cassette rack 510 according to one or more embodiments of the present disclosure may include a rear barrier 544 disposed to the rear of the first guide arm 520 and the second guide arm 530 in FIG. 4 and extending across an opening between the first guide arm 520 and the second guide arm 530. The rear barrier 544 and the guide arms 520, 530 may have the same height or different heights. For example, the height of the rear barrier 544 may be greater than the height of the guide arms 520, 530 (e.g., about 15 mm or greater). The rear barrier 544 is disposed to the rear of the guide arms 520, 530 and the opening therebetween so as to fence off one or more of the wafer cassette storage locations. Here, the rear barrier 544 is configured to keep the wafer cassette from falling off from the wafer cassette storage location in case of earthquake or similar situations by moving rearward to the opening between the first guide arm 520 and the second guide arm 530.

As discussed above, according to one or more embodiments of present disclosure, at least one of top surfaces of the first front guide block 522, the first rear guide block 524, the second front guide block 532, and the second rear guide block 534 may be arranged to support at least one or more types of wafer cassette (e.g., magazine and tray). More specifically, at least one of the first front upper guide body 526, the first rear upper guide body 528, the second front upper guide body 536, and the second rear upper guide body 538 guides a wafer cassette being unloaded by a person, person guided vehicle, automated guided vehicle or other wafer transportation device to the multi-cassette rack 510 to at least one of the top surfaces of the guide blocks 522, 524, 532, 534 with at least one of the inclined surfaces on the upper guide bodies 526, 528, 536, 538.

In accordance with embodiments of the present disclosure, the first front guide block 522 and the first rear guide block 524 are arranged to define a first space between the first front guide block 522 and first rear guide block 524 for a first bottom center part of at least one of the wafer cassette types (e.g., tray) between the first front guide block 522 and the first rear guide block 524. The second front guide block 532 and the second rear guide block 534 are arranged to define a second space between the second front guide block 532 and the second rear guide block 534 for a second bottom center part of at least one of the wafer cassette types (e.g., tray) between the second front guide block 532 and the second rear guide block 534.

Figure 5:
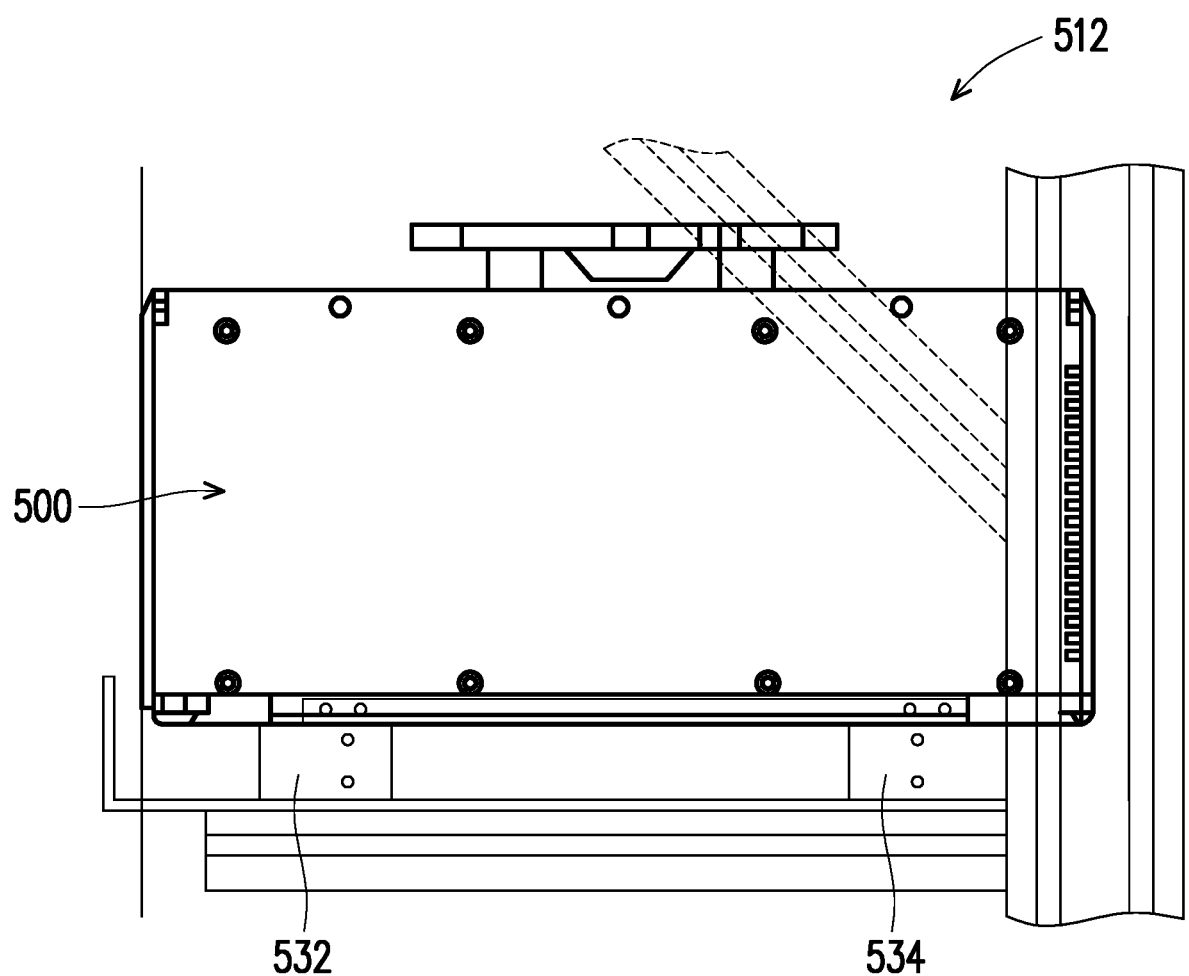
FIG. 5 is a side sectional view of the multi-cassette port 512 with a magazine cassette according to one or more embodiments of the present disclosure.

FIG. 5 is a side sectional view of multi-cassette port 512 with a magazine cassette 500 according to one or more embodiments of present disclosure.

As illustrated in FIG. 1, the stocker system 100 includes the support member system 300 (shown in FIG. 2, but not shown in FIG. 1), the multi-cassette rack 510, and the multi-cassette sorter 712 in the multi-cassette rack 510. Multi-cassette rack 510, which provides storage locations for the wafer cassettes, includes the multi-cassette port 512 to receive various types of wafer cassette (e.g. tray and magazine) which are unloaded by a person, person guided vehicle, automated guided vehicle, or other wafer transportation device. Multi-cassette port 512 also can be used to store various types of wafer cassette (e.g. tray and magazine).

FIG. 5 illustrates a structure of the multi-cassette port 512 which supports the magazine cassette 500 according to one or more embodiments of present disclosure.

The top surfaces of the first front guide block 522 (not visible in FIG. 5), the first rear guide block 524 (not visible in FIG. 5), the second front guide block 532, and the second rear guide block 534 are arranged to be in contact with the bottom surface of the magazine cassette 500. More specifically, the first front upper guide body 526, the first rear upper guide body 528, the second front upper guide body 536, and the second rear upper guide body 538 guide the magazine cassette 500 to be unloaded by a person, person guided vehicle, automated guided vehicle or other wafer transportation device to the top surfaces of the guide blocks 522, 528, 532, 534 using the inclined surfaces on the upper guide bodies 526, 528, 536, 538 as guides.

Figure 6:
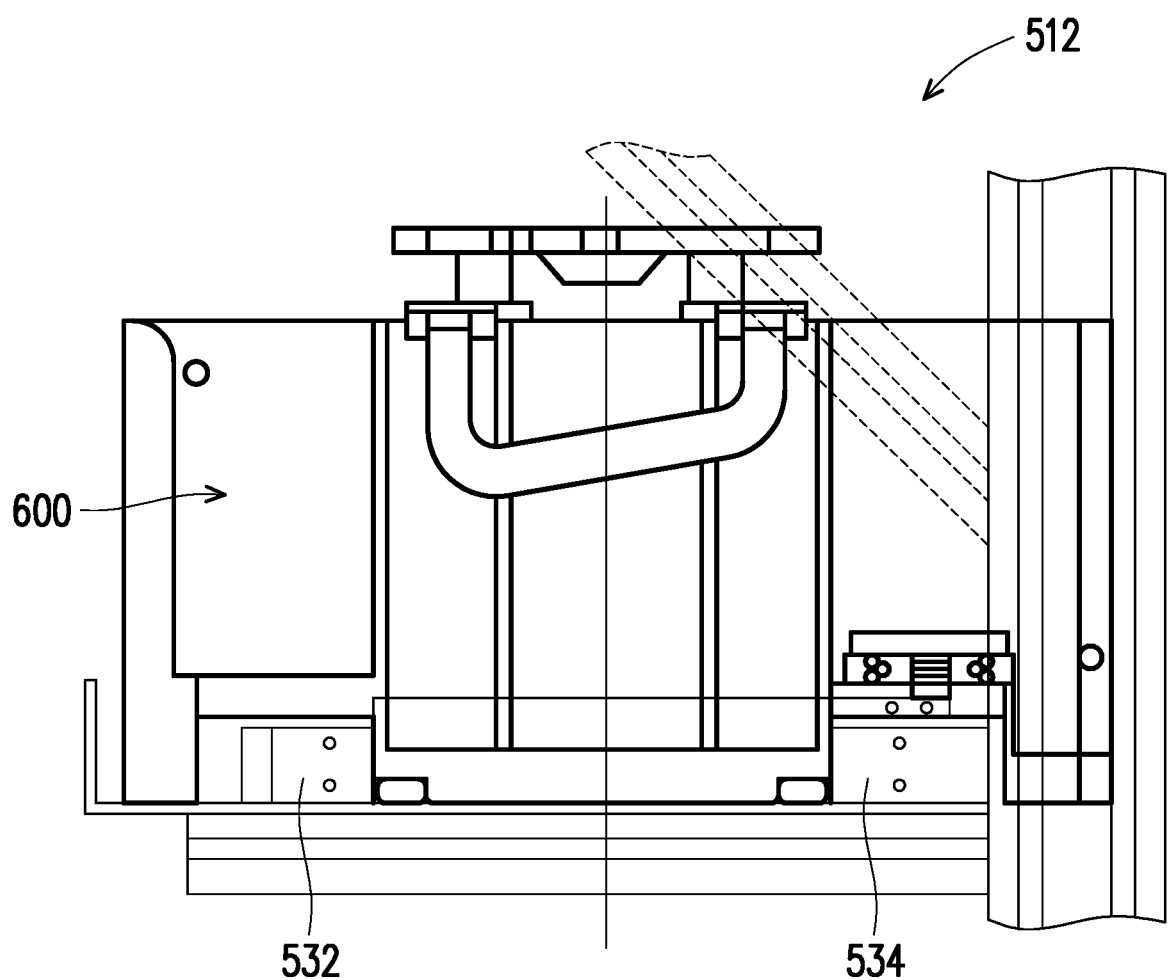
FIG. 6 is a side sectional view of the multi-cassette port 512 with a tray cassette according to one or more embodiments of the present disclosure.

FIG. 6 illustrate a side sectional view of multi-cassette port 512 with a tray cassette 600 according to one or more embodiments of present disclosure.

As illustrated in FIG. 1, the stocker system 100 includes the support member system 300 (shown in FIG. 2, but not shown in FIG. 1), the multi-cassette rack 510, and the multi-cassette sorter 712 in the multi-cassette rack 510. Multi-cassette rack 510, which provides storage locations for the wafer cassettes, includes the multi-cassette port 512 to receive various types of wafer cassette (e.g. tray and magazine) which are unloaded by a person, person guided vehicle, automated guided vehicle, or other wafer transportation device. Multi-cassette port 512 also can be used to store various types of wafer cassette (e.g. tray and magazine).

FIG. 6 illustrates a structure of the multi-cassette port 512 which supports the tray cassette 600 according to one or more embodiments of present disclosure.

The top surfaces of the first front guide block 522 (not visible in FIG. 6), the first rear guide block 524 (not visible in FIG. 6), the second front guide block 532, and the second rear guide block 534 are arranged to be in contact with the bottom surface of the tray cassette 600. More specifically, the first front upper guide body 526, the first rear upper guide body 528, the second front upper guide body 536, and the second rear upper guide body 538 are arranged to guide the tray cassette 600 to be unloaded by a person, person guided vehicle, automated guided vehicle or other wafer transportation device to the top surfaces of the guide blocks 522, 524, 532, 534 using the inclined surfaces on the upper guide bodies 526, 528, 536, 538 as guides.

The first front guide block 522 and the first rear guide block 524 are arranged to define a first space between the first front guide block 522 and the first rear guide block 524 for a first bottom center part of the tray cassette 600 between the first front guide block 522 and the first rear guide block 524. The second front guide block 532 and the second rear guide block 534 are arranged to define a second space between the second front guide block 532 and the second rear guide block 534 for a second bottom center part of the tray cassette 600 between the second front guide block 532 and the second rear guide block 534. Components of the embodiments of multi-cassette rack 510 described above with reference to FIGS. 4-6 are not limited to the specific dimensions called out above. Embodiments in accordance with the present disclosure include components of the multi-cassette rack 510 that are different from the specific dimensions described above.

Figure 7:
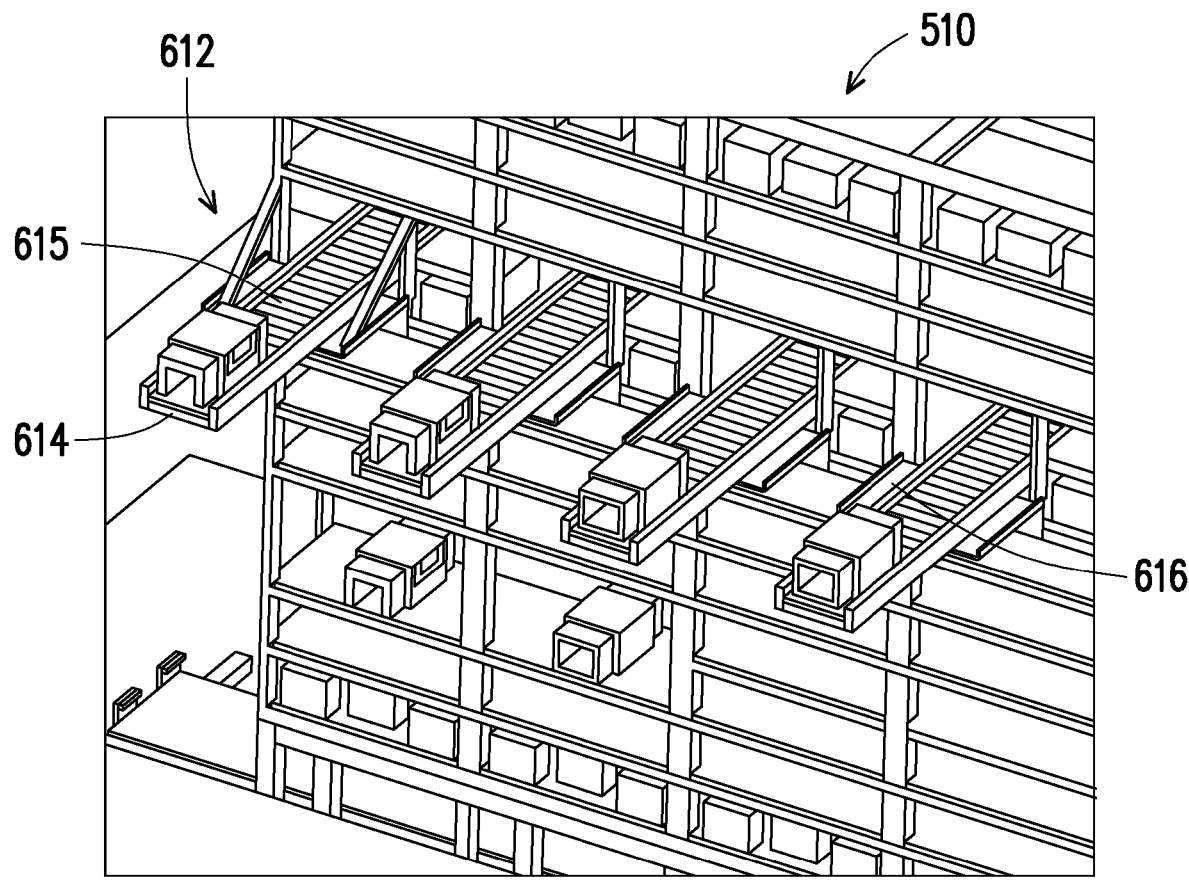
FIG. 7 is a perspective view illustrating a multi-cassette OHT port 612 according to one or more embodiments of the present disclosure.

FIG. 7 is an enlarged perspective view illustrating the multi-cassette OHT port 612 of a stocker system 100 according to one or more embodiments of the present disclosure.

Referring to FIG. 7, the multi-cassette rack 510 according to one or more embodiments of the present disclosure includes the multi-cassette OHT port 612 for receiving various types of wafer cassette transported by an overhead transport vehicle 800. For example, the overhead transport vehicle 800 carrying various types of wafer cassette travels on an overhead track and has direct access to the multi-cassette rack 510. The overhead transport vehicle 800 may be equipped with the support member system 300 to transport the various different types of wafer cassette safely. Accordingly, the multi-cassette OHT port 612, having one or more loading or unloading locations for the wafer cassettes, includes a conveyor 614 configured to transport the cassettes received at the multi-cassette OHT port 612 to the storage location in the multi-cassette rack 510. In addition, the conveyor 614 is also configured to transport the cassettes from the storage location in the multi-cassette rack 510 to the multi-cassette OHT port 612. The conveyor 614 may include a plurality of rollers 615. The conveyor 614 may further include an aligner 616. The aligner 616 is configured to keep the wafer cassette on the conveyor 614 aligned with the conveyor 614. The aligner 616 may be programmed to align various types of wafer cassette with different dimensions (e.g. tray and magazine).

Figure 8:
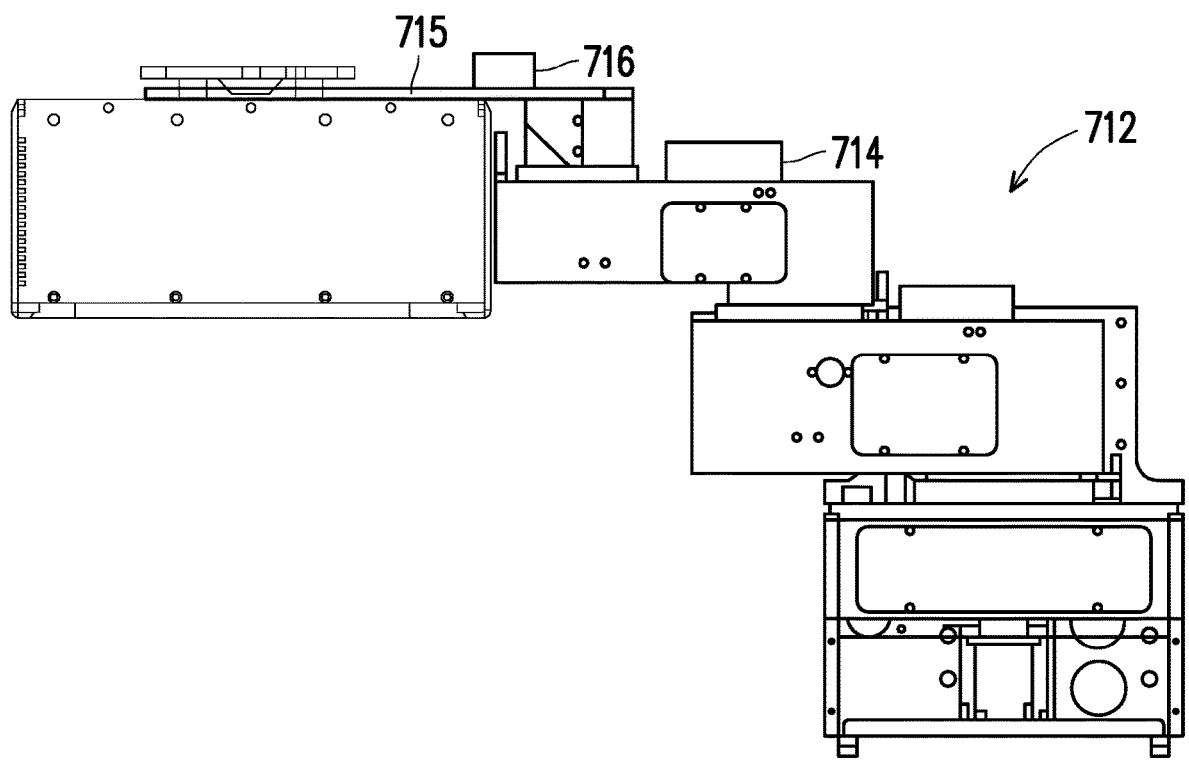
FIG. 8 is a perspective view illustrating a multi-cassette sorter 712 according to one or more embodiments of the present disclosure.

FIG. 8 is a perspective view illustrating a multi-cassette sorter 712 of the stocker system 100 according to one or more embodiments of the present disclosure.

As illustrated in FIG. 1, the stocker system 100 includes the support member system 300 (shown in FIG. 2, but not shown in FIG. 1), the multi-cassette rack 510, and the multi-cassette sorter 712 in the multi-cassette rack 510. Multi-cassette sorter 712 is configured to sort various types of wafer cassette (e.g. tray and magazine) which are transported to the multi-cassette rack 510 via the multi-cassette OHT port 612 or the multi-cassette port 512. Multi-cassette sorter 712 can be located various locations within the multi-cassette rack 510. For example, the multi-cassette sorter 712 can be located between a first rack (shown as a front rack in FIG. 1) and a second rack (shown as a rear rack in FIG. 1) of the multi-cassette rack 510 as illustrated in FIG. 1.

Referring to FIG. 8, the multi-cassette rack 510 according to one or more embodiments of the present disclosure includes a multi-cassette sorter 712 for sorting and moving various types of wafer cassette (e.g., tray and magazine) in the multi-cassette rack 510.

The multi-cassette sorter 712 is configured to pick up a wafer cassette from at least one of the multi-cassette port 512 or the multi-cassette OHT port 612 and move the wafer cassette to one of the storage locations in the multi-cassette rack 510 based on a command transmitted from a controller in the AMHS. At least some of the storage locations are arranged to be the same or similar to the multi-cassette port 512 so the multi-cassette sorter 712 can unload the various types of cassette (e.g., tray and magazine) safely. However, embodiments in accordance with the present disclosure are not limited to a multi-cassette sorter 512 configured to unload wafer cassette to the storage locations arranged similar to the multi-cassette port 512 only.

The multi-cassette sorter 712 is configured to pick up the wafer cassette from the storage location and move the wafer cassette to the multi-cassette port 512 or the multi-cassette OHT port 612 when a tool for the subsequent process is ready for the wafers in the wafer cassette.

In accordance with embodiments of the present disclosure, the multi-cassette sorter 712 includes a crane 714. The crane 714 includes a fork 715 with two arms which is configured to pick up various types of wafer cassette by gripping the top part of the wafer cassette. The crane 714 includes at least one wafer cassette detection sensor. A first wafer cassette detection sensor 716 and the second wafer cassette detection sensor 718 (shown in FIG. 1) may be disposed in parallel on each arm of the fork 715. A detection result collected by the wafer cassette detection sensors 716, 718 is used to determine the type of wafer cassette the fork has or will pick up (e.g., tray and magazine).

Providing a multi-cassette rack 510, which includes one storage location supporting various types of wafer cassette, and the multi-cassette sorter 712, which also supports various types of wafer cassette, the stocker system 100 avoids the need for multiple racks, one for each of the different types of wafer cassette types that will be processed in the fab with which the stocker is associated with.

Figure 9:
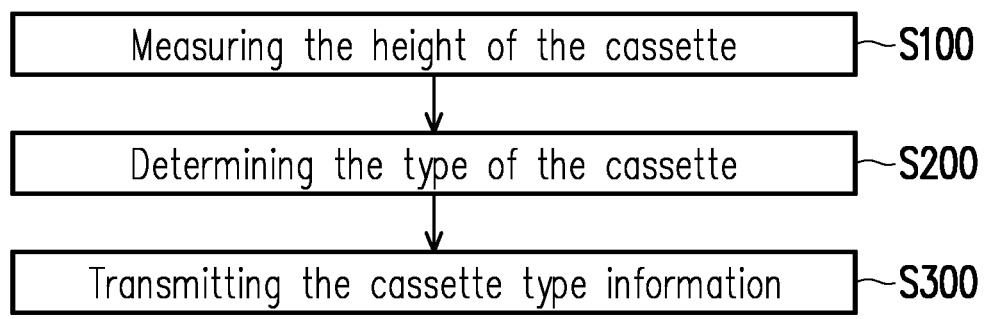
FIG. 9 is a flowchart illustrating a process of determining a cassette type using wafer cassette detection sensors 716, 718 according to one or more embodiments of the present disclosure.

FIG. 9 is a flowchart illustrating a process of determining a cassette type using the wafer cassette detection sensors 716, 718 according to one or more embodiments of present disclosure.

Referring to FIG. 9, the method of determining the cassette type according to one or more embodiments may include: step S100 of measuring the height of the cassette; step S200 of determining type of the cassette; and step S300 of transmitting the cassette information to the AMHS controller.

The step S100 of measuring the height of the cassette is a step of measuring the height using the first wafer cassette detection sensor 716 and the second wafer cassette detection sensor 718 disposed in parallel on the arms of fork 715. Each of the detection sensors 716, 718 may include an optical sensor having a light emitting member and a light detection member. The light emitting member emits light (e.g., laser or IR). When the light contacts a portion of the wafer cassette at the certain height, some of the light is reflected and returns to the optical sensor. The light detection member in the optical sensor detects and or measures the reflected light.

The step S200 of determining the type of the cassette is a step of determining type of cassette. Due to the height difference (e.g., 26 mm) between a tray cassette (height: 196 mm) and a magazine cassette (height: 170 mm), the multi-cassette sorter 712 determines (or confirms) a type of cassette the multi-cassette sorter 712 is transporting based on the reflected light measurement at a certain height. Based on the measurement result, the multi-cassette sorter 712 may determine the cassette type.

The step S300 of transmitting the cassette type information to the AMHS controller is a step of transmitting the cassette type information from the multi-cassette sorter 712 to the AMHS controller based on the determining result from the step S200. The AMHS controller may update its database based on the information from the multi-cassette sorter 712. Further the AMHS server may generate a warning to an operator if the information received form the multi-cassette sorter 712 does not match with its database.

As discussed above, the support member system 300 on the overhead transport vehicle 800 cooperates with existing safety apparatus of the overhead transport vehicle 812, 814 and extends the safety feature of the safety apparatus 812, 814 to wafer cassettes smaller than the FOUP (e.g., tray and magazine). Here, the safety feature extended by the support member system 300 may include securing the smaller wafer cassette in case of hoisting mechanism failure on the overhead transport vehicle 800. Such failures can be triggered by internal mechanical issues with the hoisting mechanism or external environment (e.g., earthquake).

In addition, the stocker system 100 including an overhead transport system 800 that includes the support member system 300 and the multi-cassette rack 510 supports a fab that utilizes various types of the wafer cassette (e.g., tray and magazine). By supporting multi-cassettes in one mixed-storage system, the stocker system 100 can be used to reduce duplicated investment in installing different stockers and sorters for each wafer cassette type without increasing the number of operators. Ultimately, the stocker system 100 can reduce the cost of making the semiconductor devices.

According to one or more embodiments, a support member system includes: an overhead transport vehicle mounting bracket including a first pivot point located at a first end of the bracket, a second pivot point located at a second end of the bracket and at least one connection point; a first support arm with a third pivot point located on a third end of the first support arm; a second support arm with a fourth pivot point located on a fourth end of the second support arm; an axle extending through the first pivot point, the second pivot point, the third pivot point, and the fourth pivot point; and a support member coupled to an end of the first support arm opposite the third end and an end of the second support arm opposite the fourth end. A support member system according to embodiments of the present disclosure can be associated with an overhead transport system to provide an additional safety feature which reduces the likelihood that wafers in a cassette being transported by the overhead transport system will be damaged in the event the cassette is unintentionally released by the overhead transport system, for example, due to operator error or due to an environmental event, such as an earthquake.

According to one or more embodiments, a stocker system is provided capable of accepting and storing different types of wafer cassettes, including wafer, tray cassettes or wafer magazine cassettes. Stocker systems in accordance with the present disclosure include: a rack; a first guide arm attached to the rack; and a second guide arm attached to the rack, the second guide arm parallel to the first guide arm, wherein the first guide arm and the second guide arm are spaced apart from each other to accommodate at least two types of wafer cassette.

The stocker system may further include a movable safety member on an overhead transport vehicle including: a bracket including a first pivot point located at a first end of the bracket, a second pivot point located at a second end of the bracket and at least one connection point which, when the bracket is associated with an overhead transport vehicle, contacts a component of the overhead transport vehicle; a first support arm with a third pivot point located on a third end of the first support arm; a second support arm with a fourth pivot point located on a fourth end of the second support arm; an axle extending through the first pivot point, the second pivot point, the third pivot point, and the fourth pivot point; and a support member coupled to the first support arm and second support arm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A stocker system, comprising:
a multi-cassette rack configured to, in operation, store at least two different types of wafer cassettes;
one or more multi-cassette ports within the multi-cassette rack,
each respective multi-cassette port including:
a first end and a second end opposite to the first end;
a first side and a second side opposite to the first side, the first side and the second side extend from the first end to the second end;
a first guide arm attached to the multi-cassette rack, the first guide arm being positioned at the first side; and a second guide arm attached to the rack, the second guide arm parallel to the first guide arm and the second guide arm being positioned at the second side,
wherein the first guide arm and the second guide arm are spaced apart from each other to accommodate at least two different types of wafer cassettes,
the two different types of wafer cassettes having a different size and shape relative to each other.

2. The stocker system according to claim 1, wherein the first guide arm includes:
a first front guide block; and
a first rear guide block, the first front guide block disposed at a front end of the first guide arm and the first rear guide block disposed at a rear end of the first guide arm;
wherein the second guide arm includes:
a second front guide block; and
a second rear guide block, the second front guide block disposed at a front end of the second guide arm and the second rear guide block disposed at a rear end of the second guide arm.

3. The stocker system according to claim 2, wherein the first guide arm includes:
a first front upper guide body disposed on the first front guide block; and
a first rear upper guide body disposed on the first rear guide block,
wherein the second guide arm includes:
a second front upper guide body disposed on the second front guide block; and
a second rear upper guide body disposed on the second rear guide block.

4. The stocker system according to claim 3, wherein at least one of the upper guide bodies includes an inclined surface.

5. The stocker system according to claim 4, wherein the inclined surface of the first front upper guide body is facing the inclined surface of the second front upper guide body, and wherein the inclined surface of the first rear upper guide body is facing the inclined surface of the second rear upper guide body.

6. The stocker system according to claim 1, further comprising at least one Overhead Hoist Transport (OHT) port.

7. The stocker system according to claim 2, wherein top surfaces of the first front guide block, the first rear guide block, the second front guide block, and the second rear guide block are arranged to support an A type wafer cassette.

8. The stocker system according to claim 7, wherein the first front guide block and the first rear guide block are arranged to have a first space for a first bottom center part of a B type wafer cassette between the first front guide block and the first rear guide block, and
wherein the second front guide block and the second rear guide block are arranged to have a second space for a second bottom center part of the B type wafer cassette between the second front guide block and the second rear guide block.

9. The stocker system according to claim 1, further comprising a wafer cassette sorter having at least one wafer cassette detection sensor, wherein the wafer cassette detection sensor is used to determine whether a wafer cassette is an A type wafer cassette or a B type wafer cassette.

10. A system, comprising:
a multi-cassette rack configured to, in operation, store at least two different types of wafer cassettes having a different size and shape relative to each other;
one or more multi-wafer cassette ports within the multi-cassette rack, each multi-wafer cassette port is configured to, in operation, receive the at least two different types of wafer cassettes; and
a multi-cassette sorter configured to, in operation, sort the at least two different types of wafer cassettes, the multi-cassette sorter including:
a wafer cassette support end configured to, in operation, pick up the at least two different types of wafer cassettes; and
one or more wafer cassette detection sensors configured to, in operation, determine a type of the at least two different types of wafer cassettes.

11. The system of claim 10, wherein respective types of the at least two different types of wafer cassettes includes a wafer tray and a wafer magazine.

12. The system of claim 10, wherein the wafer cassette support end of the multi-cassette sorter is a fork including at least two arms.

13. The system of claim 10, wherein the one or more wafer cassette detection sensors includes:
a first detection sensor on the wafer cassette support end; and
a second detection sensor on the wafer cassette support end and spaced apart from the first detection sensor, and
wherein the first and second detection sensors are configured to, in operation, determine a dimension of a respective wafer cassette on the wafer cassette support end to determine the type of the at least two different types of wafer cassettes.

14. The system of claim 10, further comprising:
a multi-cassette rack including:
a first guide arm includes a plurality of first guide blocks and a plurality of first guide bodies, each respective first guide body of the plurality of first guide bodies overlaps a corresponding first guide block of the plurality of first guide blocks; and
a second guide arm opposite to the first guide arm and spaced apart from the first guide arm, the second guide arm includes a plurality of second guide blocks and a plurality of second guide bodies, each respective second guide body of the plurality of second guide bodies overlaps a corresponding second guide block of the plurality of second guide blocks;
wherein the first guide arm and the second guide arm are configured to, in operation, receive different types of wafer cassettes, and the types of the different types of wafer cassettes including at least two different types of wafer cassettes.

15. The system of claim 10, wherein the at least two different types of wafer cassettes includes a wafer tray and a wafer magazine.

16. A system comprising: a multi-cassette sorter configured to, in operation, sort at least two different types of wafer cassettes with a different size and shape relative to each other,
the multi-cassette sorter including:
a wafer cassette support end configured to, in operation, pick up the at least two different types of wafer cassettes; and
one or more wafer cassette detection sensors configured to, in operation, determine a type of the at least two different types of wafer cassettes;
a multi-cassette rack configured to, in operation, store the at least two different types of wafer cassettes;
one or more multi-cassette ports within the multi-cassette rack, each respective multi-cassette port including:

a first end and a second end opposite to the first end;

a first side and a second side opposite to the first side, the first side and the second side extend from the first end to the second end;

a first guide arm attached to the multi-cassette rack, the first guide arm being positioned at the first side; and a second guide arm attached to the multi-cassette rack and at the second side, the second guide arm parallel to the first guide arm, wherein the first guide arm and the second guide arm are spaced apart from each other to accommodate the at least two different types of wafer cassettes.

17. The system of claim 16, wherein:

the first guide arm includes a plurality of first guide blocks and a plurality of first guide bodies, each respective first guide body of the plurality of first guide bodies overlaps a corresponding first guide block of the plurality of first guide blocks;

a second guide arm opposite to the first guide arm and spaced apart from the first guide arm, the second guide arm includes a plurality of second guide blocks and a plurality of second guide bodies, each respective second guide body of the plurality of second guide bodies overlaps a corresponding second guide block of the plurality of second guide blocks; and the first guide arm and the second guide arm are configured to, in operation, receive the at least two types of wafer cassettes.

18. The system of claim 16, wherein the one ne one or more wafer cassette detection sensors include:

a first detection sensor on the wafer cassette support end; and a second detection sensor on the wafer cassette support end and spaced apart from the first detection sensor.

19. The system of claim 18, the wafer cassette support end is a fork.

20. The system of claim 19, wherein the fork includes at least two arms.

21. The system of claim 18, wherein the first and second detection sensors are configured to, in operation, determine a dimension of a respective wafer cassette on the support end to determine the type of the at least two types of wafer cassettes that is or will be picked up by the wafer cassette support end.

22. The system of claim 16, wherein the at least two different types of wafer cassettes includes a wafer tray and a wafer magazine.

* * * * *